United States Patent
Miyano

(10) Patent No.: US 6,624,777 B2
(45) Date of Patent: Sep. 23, 2003

(54) FAST A/D CONVERSION SIGNAL PROCESSOR, RF RECEIVER CIRCUIT, DIGITAL RECEIVER FRONT END CIRCUIT, MRI APPARATUS, AND FAST A/D CONVERSION DEVICE

(75) Inventor: Hiroyuki Miyano, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/143,168

(22) Filed: May 10, 2002

(65) Prior Publication Data

US 2002/0167434 A1 Nov. 14, 2002

(30) Foreign Application Priority Data

May 11, 2001 (JP) .......................... 2001-141186

(51) Int. Cl.⁷ .................. H03M 1/12; G01V 3/00
(52) U.S. Cl. .................. 341/155; 324/322
(58) Field of Search .................. 341/155, 156, 341/159, 122, 139, 161; 375/226; 600/528, 439, 333; 332/167; 324/322

(56) References Cited

U.S. PATENT DOCUMENTS

| | | | | |
|---|---|---|---|---|
| 4,532,637 A | * | 7/1985 | Maine | 375/226 |
| 4,839,652 A | * | 6/1989 | O'Donnell et al. | 341/122 |
| 5,227,728 A | | 7/1993 | Kaufman et al. | |
| 5,442,290 A | | 8/1995 | Crooks | |
| 5,529,068 A | | 6/1996 | Hoenninger, III et al. | |
| 5,739,691 A | | 4/1998 | Hoenninger, III | |
| 6,043,659 A | * | 3/2000 | McKinnon | 324/322 |
| 6,201,393 B1 | | 3/2001 | Bernstein et al. | |
| 6,242,916 B1 | | 6/2001 | King | |
| 6,281,681 B1 | | 8/2001 | Cline et al. | |
| 6,356,780 B1 | | 3/2002 | Licato et al. | |
| 6,445,328 B1 | * | 9/2002 | Francis | 341/155 |
| 6,452,391 B1 | | 9/2002 | Bernstein et al. | |
| 6,459,265 B1 | | 10/2002 | Lou et al. | |
| 6,462,544 B1 | | 10/2002 | McKinnon | |

* cited by examiner

Primary Examiner—Patrick Wamsley
(74) Attorney, Agent, or Firm—Carl B. Horton, Esq.; Armstrong Teasdale LLP

(57) ABSTRACT

For the proper delivery of digital data D_AD from a fast A/D converter to a digital signal process section, the digital data is stored in a dual-clock-synchronous FIFO by being timed to the output of digital data from the fast A/D converter (at the timing based on a data ready signal DATA_RDY). The dual-clock-synchronous FIFO reads out digital data D_FIFO and delivers to the digital signal process section by being timed to the operation of the digital signal process section (at the timing based on a clock signal CLK_DIG for a digital signal process).

12 Claims, 5 Drawing Sheets

Fast A/D conversion signal processor 10

FAST A/D CONVERSION SIGNAL
PROCESSOR, RF RECEIVER CIRCUIT,
DIGITAL RECEIVER FRONT END CIRCUIT,
MRI APPARATUS, AND FAST A/D
CONVERSION DEVICE

CROSS REFERENCE TO RELATED APPLICATIONS

This application claims the benefit of Japanese Application No. 2001-141186 filed May 11, 2001.

BACKGROUND OF THE INVENTION

The present invention relates to a fast A/D (Analog to Digital) conversion signal processor, an RF (Radio Frequency) receiver circuit, a digital receiver front end circuit, an MRI (Magnetic Resonance Imaging) apparatus, and a fast A/D conversion device. More particularly, the invention relates to a fast A/D conversion signal processor which, even in the presence of discordance in terms of timing between the output of digital data from a fast A/D converter and the clock signal for a digital signal process used by a digital signal process section, can absorb the discordance and deliver the digital data from the fast A/D converter to the digital signal process section properly, an RF receiver circuit and digital receiver front end circuit which can be used for the fast A/D conversion signal processor, an MRI apparatus which uses the fast A/D conversion signal processor, and a fast A/D conversion device which can be used for the fast A/D conversion signal processor.

In recent years, digitization of signal processing is advancing also in MRI apparatus. Specifically, in an advanced scheme, an NMR signal received by a receiving coil is converted with a fast A/D converter into digital data, with resulting digital-data being delivered to a digital signal process section, which implements a digital signal processing (e.g., digital filtering) for the digital data, with resulting data being delivered to a computer, which implements an image recomposing process or the like.

In delivering digital data released by a fast A/D converter to a digital signal process section, there emerges the discordance in terms of timing between the output of digital data from the fast A/D converter and the clock signal for a digital signal process used by the digital signal process section.

This timing discordance is the natural consequence in case the clock signal for the fast A/D converter and the clock signal for the digital signal process are produced independently of each other, and it also emerges when one clock signal is used distributively as both clock signals. Conceivable causes are that the clock signal circuit for the fast A/D converter uses an RF pulse transformer for generating differential RF clock signals which are needed by the fast A/D converter, and that there is the disparity in the timing of output of digital data from the fast A/D converter among circuit devices, and that there is a difference between the delay time of a digital data transfer system and the delay time of a clock signal transfer system.

Hence, in the presence of the above-mentioned discordance of timing, it is problematic in that the fast A/D converter can possibly fail to deliver digital data to the digital signal process section properly.

SUMMARY OF THE INVENTION

Therefore, a first object of the present invention is to provide a fast A/D conversion signal processor which, even in the presence of discordance in terms of timing between the output of digital data from a fast A/D converter and the clock signal for a digital signal process used by a digital signal process section, can absorb the discordance and deliver the digital data from the fast A/D converter to the digital signal process section properly.

A second object of the present invention is to provide an RF receiver circuit and digital receiver front end circuit which can be used for the fast A/D conversion signal processor.

A third object of the present invention is to provide an MRI apparatus which uses the fast A/D conversion signal processor.

A fourth object of the present invention is to provide a fast A/D conversion device which can be used for the fast A/D conversion signal processor.

At a first viewpoint, the present invention resides in a fast A/D conversion signal processor which is characterized by comprising a fast A/D converter which converts an input analog signal into digital data at an operation speed of 20 MHz or higher, a digital signal process section which implements a digital signal processing for the digital data, and data memory means which stores the digital data released by the fast A/D converter in synchronism with a data ready signal provided by the fast A/D converter and reads out the stored digital data and delivers to the digital signal process section in synchronism with a clock signal for a digital signal process used by the digital signal process section.

In the fast A/D conversion signal processor of the first viewpoint, digital data is stored in the data memory means at the timing of output of the digital data from the fast A/D converter (at the timing which is based on the data ready signal). Digital data is read out of the data memory means and delivered to the digital signal process section at the operation timing of the digital signal process section (at the timing which is based on the clock signal for the digital signal process). In consequence, even in the presence of discordance in terms of timing between the output of digital data from the fast A/D converter and the clock signal for the digital signal process used by the digital signal process section, the discordance is absorbed by the intervention of the data memory means and the digital data can be delivered from the fast A/D converter to the digital signal process section properly.

In the above-mentioned arrangement, the "data ready signal" signifies a "signal indicative of the output period of valid data", and it may be called "data valid signal".

At a second viewpoint, the present invention resides in the fast A/D conversion signal processor of the foregoing arrangement, which is characterized in that the data memory means includes a dual-clock-synchronous FIFO (First-In-First-Out), a write control circuit which responds to a start signal indicative of the commencement of storing to store the digital data released by the fast A/D converter into the dual-clock-synchronous FIFO in synchronism with the data ready signal, and a readout control circuit which responds to an empty signal provided by the dual-clock-synchronous FIFO to read the digital data out of the dual-clock-synchronous FIFO in synchronism with the clock signal for the digital signal process.

In the fast A/D conversion signal processor of the second viewpoint, it is possible to write the digital data released by the fast A/D converter into the dual-clock-synchronous FIFO based on the input of the start signal from the outside. Digital data is read out of the dual-clock-synchronous FIFO in response to the empty signal which is produced when the digital data is written into the dual-clock-synchronous FIFO, and consequently the digital data can be delivered from the fast A/D converter to the digital signal process section properly.

At a third viewpoint, the present invention resides in the fast A/D conversion signal processor of the foregoing arrangement, which is characterized in that the readout control circuit produces and releases a sync ready signal for indicating to the outside that digital data is amid the readout of the dual-clock-synchronous FIFO.

In the fast A/D conversion signal processor of the third viewpoint, it is possible to know the output timing of digital data from the dual-clock-synchronous FIFO by monitoring the sync ready signal.

At a fourth viewpoint, the present invention resides in the fast A/D conversion signal processor of the foregoing arrangement, which is characterized by comprising a high-stability crystal oscillator, an RF multiplying circuit which produces an RF clock signal having a frequency that is a multiple of the frequency of the output signal of the high-stability crystal oscillator, and an RF pulse transformer which produces differential RF clock signals to be used by the fast A/D converter from the RF clock signal.

With the fast A/D conversion signal processor of the fourth viewpoint, it is possible to produce properly the differential RF clock signals needed by the fast A/D converter.

At a fifth viewpoint, the present invention resides in the fast A/D conversion signal processor of the foregoing arrangement, which is characterized by comprising a separation RF pulse transformer which produced from the RF clock signal a separated clock signal which is separated electrically from the RF clock signal, and a comparator which produces the clock signal for the digital signal process from the separated clock signal.

In the fast A/D conversion signal processor of the fifth viewpoint, it is possible to produce from one clock signal the differential RF clock signals needed by the fast A/D converter and the clock signal for the digital signal process. In addition, using the separation RF pulse transformer can prevent the entry of noises from one of the analog RF circuit and digital circuit into another by way of the clock transfer system.

At a sixth viewpoint, the present invention resides in an MRI apparatus which is characterized by including the fast A/D conversion signal processor of the foregoing arrangement, and being adapted to process with the fast A/D conversion signal processor an NMR signal which is received by a receiving coil.

With the MRI apparatus of the sixth viewpoint, it is possible to advance properly the digitization of process of the received signal of MRI apparatus.

At a seventh viewpoint, the present invention resides in an RF receiver circuit which is characterized by comprising a fast A/D converter which converts an input analog signal into digital data at an operation speed of 20 MHz or higher, a high-stability crystal oscillator, an RF multiplying circuit which produces an RF clock signal having a frequency that is a multiple of the frequency of the output signal of the high-stability crystal oscillator, an RF pulse transformer which produces differential RF clock signals to be used by the fast A/D converter from the RF clock signal, a clock driver which delivers to the outside a data ready signal produced by the fast A/D converter, a separation RF pulse transformer which produced from the RF clock signal a separated clock signal which is separated electrically from the RF clock signal, a comparator which produces a clock signal for a digital signal process from the separated clock signal, and a latch which holds and releases in synchronism with the data ready signal the digital data released by the fast A/D converter.

By using the RF receiver circuit of the seventh viewpoint, it is possible to advance properly the digitization of process of the received signal of MRI apparatus.

At an eighth viewpoint, the present invention resides in a digital receiver front end circuit which is characterized by comprising a first clock buffer which produces a data ready signal from a first input clock signal, a second clock buffer which produces from a second input clock signal and releases also to the outside a clock signal for a digital signal process, a latch which holds and releases input digital data in synchronism with the data ready signal, and data memory means which stores the digital data released by the latch in synchronism with the data ready signal and reads out and releases the stored digital data in synchronism with the clock signal for the digital signal process.

By using the digital receiver front end circuit of the eighth viewpoint, it is possible to advance properly the digitization of process of the received signal of MRI apparatus.

At a ninth viewpoint, the present invention resides in the digital receiver front end circuit of the foregoing arrangement, which is characterized in that the data memory means includes a dual-clock-synchronous FIFO, a write control circuit which responds to a start signal indicative of the commencement of storing to store the input digital data into the dual-clock-synchronous FIFO in synchronism with the data ready signal, and a readout control circuit which responds to an empty signal provided by the dual-clock-synchronous FIFO to read the digital data out of the dual-clock-synchronous FIFO in synchronism with the clock signal for the digital signal process.

By using the digital receiver front end circuit of the ninth viewpoint, it is possible to advance properly the digitization of process of the received signal of MRI apparatus.

At a tenth viewpoint, the present invention resides in the digital receiver front end circuit of the foregoing arrangement, which is characterized in that the readout control circuit produces and releases a sync ready signal for indicating to the outside that digital data is amid the readout of the dual-clock-synchronous FIFO.

By using the digital receiver front end circuit of the tenth viewpoint, it is possible to advance properly the digitization of process of the received signal of MRI apparatus.

At an eleventh viewpoint, the present invention resides in an MRI apparatus which is characterized by comprising the RF receiver circuit of the foregoing arrangement, the digital receiver front end circuit of the foregoing arrangement, and a digital signal process section, and characterized in that an NMR signal received by a receiving coil is put as input analog signal into the RF receiver circuit, the digital data released by the latch of the RF receiver circuit is put as input digital data into the digital receiver front end circuit, the data ready signal provided by the clock driver of the RF receiver circuit is put as a first input clock signal into the digital receiver front end circuit, the clock signal for the digital signal process provided by the comparator of the RF receiver circuit is put as a second input clock signal into the digital receiver front end circuit, and the digital data released by the dual-clock-synchronous FIFO of the digital receiver front end circuit and the clock signal for the digital signal process provided by the second clock buffer are put into the digital signal process section.

With the digital receiver front end circuit of the eleventh viewpoint, it is possible to advance properly the digitization of process of the received signal.

At a twelfth viewpoint, the present invention resides in an MRI apparatus which is characterized by comprising the RF receiver circuit of the foregoing arrangement, the digital receiver front end circuit of the foregoing arrangement, a digital signal process section, and a control logic section which produces the start signal and puts into the digital receiver front end circuit in response to a pulse sequence, and characterized in that an NMR signal received by a receiving coil is put as input analog signal into the RF receiver circuit, the digital data released by the latch of the RF receiver circuit is put as input digital data into the digital receiver front end circuit, the data ready signal provided by the clock driver of the RF receiver circuit is put as a first input clock signal into the digital receiver front end circuit, the clock signal for the digital signal process provided by the comparator of the RF receiver circuit is put as a second input clock signal into the digital receiver front end circuit, the digital data released by the dual-clock-synchronous FIFO of the digital receiver front end circuit and the clock signal for the digital signal process provided by the second clock buffer are put into the digital signal process section, and the clock signal for the digital signal process provided by the second clock buffer of the digital receiver front end circuit is put into the control logic section.

With the digital receiver front end circuit of the twelfth viewpoint, it is possible to advance properly the digitization of process of the received signal.

At a thirteenth viewpoint, the present invention resides in an MRI apparatus which is characterized by comprising the RF receiver circuit of the foregoing arrangement, the digital receiver front end circuit of the foregoing arrangement, a digital signal process section, and a control logic section which produces the start signal and puts into the digital receiver front end circuit in response to a pulse sequence, and characterized in that an NMR signal received by a receiving coil is put as input analog signal into the RF receiver circuit, the digital data released by the latch of the RF receiver circuit is put as input digital data into the digital receiver front end circuit, the data ready signal provided by the clock driver of the RF receiver circuit is put as a first input clock signal into the digital receiver front end circuit, the clock signal for the digital signal process provided by the comparator of the RF receiver circuit is put as a second input clock signal into the digital receiver front end circuit, the digital data released by the dual-clock-synchronous FIFO of the digital receiver front end circuit and the clock signal for the digital signal process provided by the second clock buffer are put into the digital, signal process section, and the sync ready signal provided by the readout control circuit of the digital receiver front end circuit and the clock signal for the digital signal process provided by the second clock buffer are put into the control logic section.

With the digital receiver front end circuit of the thirteenth viewpoint, it is possible to advance properly the digitization of process of the received signal.

At a fourteenth viewpoint, the present invention resides in a fast A/D conversion device which is characterized by comprising a fast A/D converter which converts an input analog signal into digital data at an operation speed of 20 MHz or higher, and data memory means which stores the digital data released by the fast A/D converter in synchronism with a data ready signal provided by the fast A/D converter and reads out the stored digital data in synchronism with a readout clock signal provided from the outside.

In the fast A/D conversion device of the fourteenth viewpoint, digital data is stored in the data memory means at the timing of output of the digital data from the fast A/D converter. Digital data is read out of the data memory means in synchronism with a readout clock signal provided from the outside. In consequence, even in the presence of discordance in terms of timing between the output of digital data from the fast A/D converter and the clock signal for a digital signal process used by an external circuit which processes the digital data, it is possible to absorb the discordance.

At a fifteenth viewpoint, the present invention resides in the fast A/D conversion device of the foregoing arrangement, which is characterized in that the data memory means includes a dual-clock-synchronous FIFO, a write control circuit which responds to a start signal provided from the outside to store the digital data released by the fast A/D converter into the dual-clock-synchronous FIFO in synchronism with the data ready signal, and a readout control circuit which responds to an empty signal provided by the dual-clock-synchronous FIFO to read the digital data out of the dual-clock-synchronous FIFO in synchronism with the readout clock signal.

In the fast A/D conversion device of the fifteenth viewpoint, it is possible by providing the start signal from the outside to write the digital data released by the fast A/D converter into the dual-clock-synchronous FIFO. Digital data is read out of the dual-clock-synchronous FIFO in response to the empty signal which is produced at the time of writing of the digital data into the dual-clock-synchronous FIFO, and consequently it is possible to deliver properly the digital data from the fast A/D converter to an external circuit which processes the digital data.

At a sixteenth viewpoint, the present invention resides in the fast A/D conversion device of the foregoing arrangement, which is characterized in that the readout control circuit produces and releases a sync ready signal for indicating to the outside that digital data is amid the readout of the dual-clock-synchronous FIFO.

In the fast A/D conversion device of the sixteenth viewpoint, it is possible to know the output timing of digital data from the dual-clock-synchronous FIFO by monitoring the sync ready signal.

According to the fast A/D conversion signal processor of this invention, even in the presence of discordance in terms of timing between the output of digital data from the fast A/D converter and the clock signal for a digital signal process used by the digital signal process section, it becomes possible to absorb the discordance and deliver the digital data from the fast A/D converter to the digital signal process section properly.

According to the RF receiver circuit and digital receiver front end circuit of this invention, it is possible to arrange the fast A/D conversion signal processor properly.

According to the MRI apparatus of this invention, it becomes possible to attain the digitization of process of the received signal.

Further objects and advantages of the present invention will be apparent from the following description of the preferred embodiments of the invention as illustrated in the accompanying drawings.

DETAILED DESCRIPTION OF THE INVENTION

Embodiments of the present invention will be explained with reference to the drawings.

First Embodiment

Figure 1:
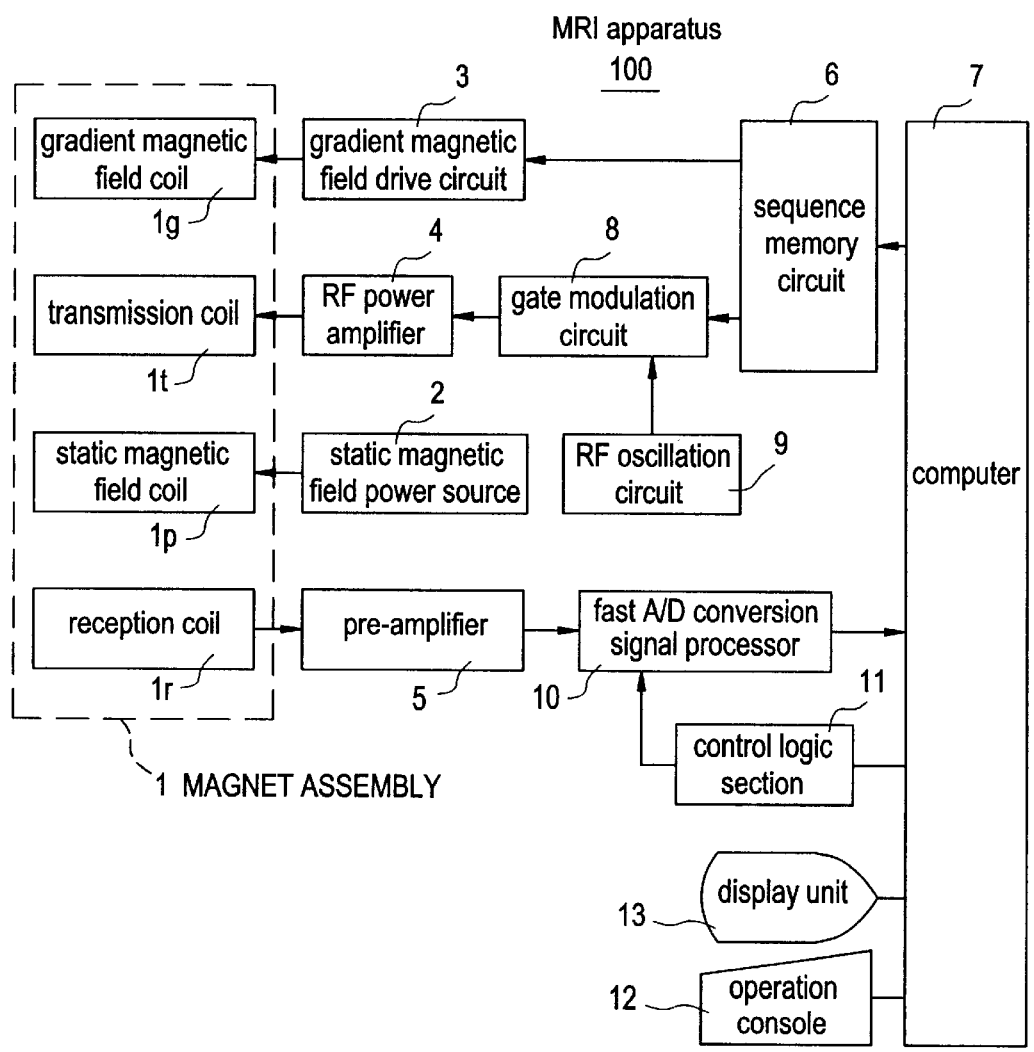
FIG. 1 is a block diagram showing the MRI apparatus based on the first embodiment.

FIG. 1 is a block diagram showing the MRI apparatus 100 based on the first embodiment of this invention.

In this MRI apparatus 100, a magnet assembly 1 has a room section (bore) in which a subject of inspection is placed, and disposed around the room section area static magnetic field coil 1p which applies a constant static magnetic field to the subject, a gradient magnetic field coil 1g for generating a gradient magnetic field of the x axis, y axis and z axis (a slice gradient axis, read gradient axis and phase encode gradient axis are formed by the combination of the x axis, y axis and z axis), a transmission coil 1t which produces an RF pulse for inducing the spin of atomic nucleus in the subject, and a reception coil 1r which detects the NMR signal from the subject. The static magnetic field coil 1p, gradient magnetic field coil 1g, transmission coil 1t and reception coil 1r are connected to a static magnetic field power source 2, gradient magnetic field drive circuit 3, RF power amplifier 4 and pre-amplifier 5, respectively.

A permanent magnet may be used in place of the static magnetic field coil 1p and static magnetic field power source 2.

A sequence memory circuit 6 operates on the gradient magnetic field drive circuit 3 in accordance with the commands from a computer 7 and based on the stored pulse sequence so that the gradient magnetic field coil 1g of the magnet assembly 1 produces a gradient magnetic field and operates on a gate modulation circuit 8 to modulate the carrier output signal of an RF oscillation circuit 9 into a pulse signal having a certain timing and certain envelope, puts the resulting RF pulse into the RF power amplifier 4, and applies the amplified RF pulse to the transmission coil it of the magnet assembly 1 so that an intended imaging plane is excited selectively.

The pre-amplifier 5 amplifies the NMR signal from the subject received by the reception coil 1r of the magnet assembly 1 and puts the amplified signal to a fast A/D conversion signal processor 10. The fast A/D conversion signal processor 10 converts the NMR signal into digital data, implements a digital signal processing, and enters the resulting data into computer 7. The fast A/D conversion signal processor 10 will be explained in detail later.

A control logic section 11 controls the operation of the fast A/D conversion signal processor 10 based on the command from the computer 7.

The computer 7 receives information which is entered from a control console 12. The computer 7 reads in digital data from the A/D conversion signal processor 10, and implements the calculation of image reconstruction to produce an MR image. The computer 7 also implements general control including the above-mentioned control.

A display unit 13 displays the MR image.

Figure 2:
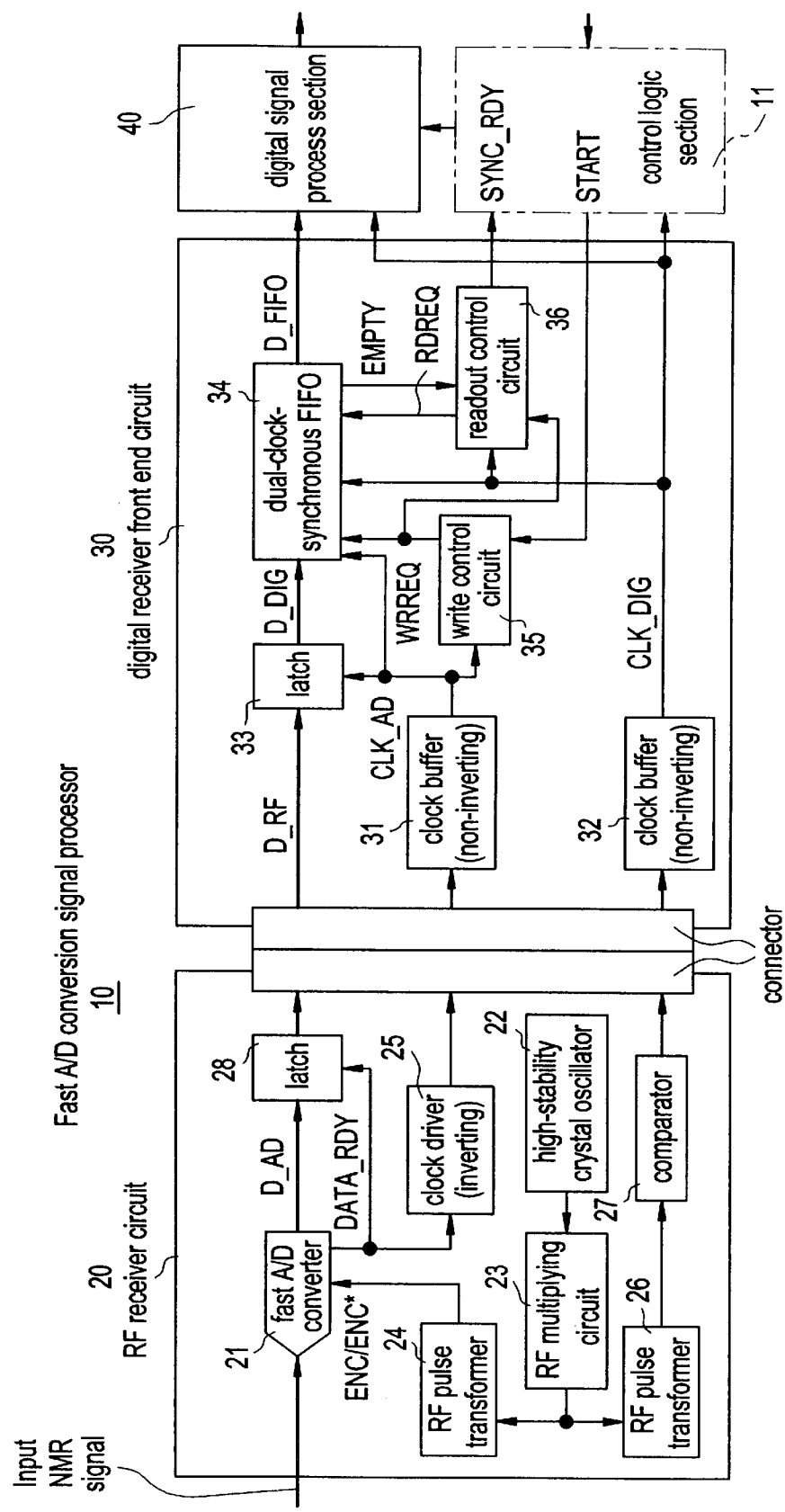
FIG. 2 is a block diagram showing the fast A/D conversion signal processor based on the first embodiment.

FIG. 2 is a block diagram showing an example of arrangement of the fast. A/D conversion signal processor 10.

The fast A/D conversion signal processor 10 includes an RF receiver circuit 20, a digital receiver front end circuit 30, and a digital signal processing circuit 40.

The RF receiver circuit 20 is shielded electrically and magnetically against digital circuits including the digital receiver front end circuit 30 and digital signal processing circuit 40 so as to prevent the entry of noises from the digital circuits.

The RF receiver circuit 20 is arranged to include a fast A/D converter 21 which converts the input NMR signal into digital data D__AD at an operation speed of 20 MHz, 40 MHz, etc., a high-stability crystal oscillator 22, an RF multiplying circuit 23 which produces an RF clock signal having a frequency that is a multiple of the frequency of the output signal of the high-stability crystal oscillator 22, an RF pulse transformer 24 for fast A/D converter which produces differential RF clock signals ENC/ENC* to be used by the fast A/D converter from the RF clock signal, a clock driver 25 which inverts and releases to the outside a data ready signal DATA__RDY provided by the fast A/D converter 21, a separation RF pulse transformer 26 which produced from the RF clock signal a separated clock signal which is separated electrically from the RF clock signal, a comparator 27 which produces a clock signal for a digital signal process from the separated clock signal, and a latch 28 which holds the digital data D__AD released by the fast A/D converter 21 and releases digital data D__RF in synchronism with the data ready signal DATA__RDY.

Figure 5:
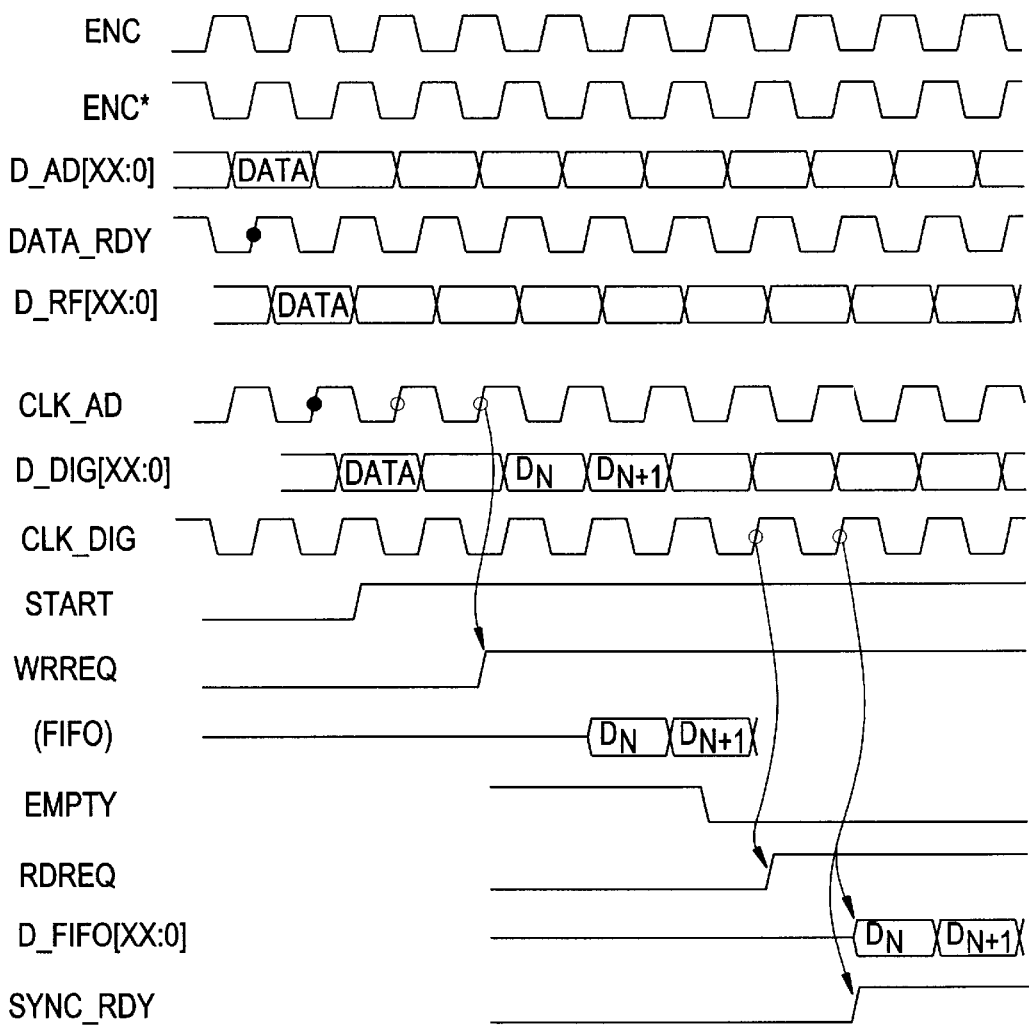
FIG. 5 is a flowchart of the signals of the first embodiment.

FIG. 5 shows the timing of the differential RF clock signals ENC/ENC*, digital data D__AD, data ready signal DATA__RDY, and digital data D__RF.

The digital data D__AD is released at the rising edge of the differential RF clock signal ENC (falling edge of ENC*). The data ready signal DATA__RDY is produced at the time when the digital data D__AD settles. The digital data D__RF is released at the rising edge of the data ready signal DATA__RDY.

Returning to FIG. 2, the digital receiver front end circuit 30 is arranged to include a first clock buffer 31 which produces a data ready signal CLK__AD from the data ready signal DATA__RDY provided by the clock driver 25 of the RF receiver circuit 20, a second clock buffer 32 which produces and releases to the outside a clock signal CLK__DIG for a digital signal process from the clock signal for the digital signal process provided by the comparator 27 of the RF receiver circuit 20, a latch 33 which holds the digital data D__RF provided by the latch 28 of the RF receiver circuit 20 and releases digital data D__DIG in synchronism with the data ready signal CLK__AD, a dual-clock-synchronous FIFO 34 which stores the digital data D__DIG in synchronism with the data ready signal CLK__AD when a write request signal WRREQ becomes "H", turns an empty signal EMPTY to "L" when it has stored at least one piece of digital data D__DIG, and reads out the stored digital data D__DIG and releases digital data D__FIFO in synchronism with the clock signal CLK__DIG for the digital signal process when a read request signal RDREQ becomes "H", a write control circuit 35 which responds to a start signal START provided by the control logic section 11 to turn the write request signal WRREQ to "H" in synchronism with the data ready signal CLK__AD, and a readout control circuit 36 which responds to the empty signal EMPTY provided by the dual-clock-synchronous FIFO 34 to turn the read request signal RDREQ to "H" in synchronism with the clock signal CLK_DIG for the digital signal process and produces and releases to the outside a sync ready signal SYNC_RDY for indicating to the outside that the digital data $D_{FIFO}$ is amid the release from the dual-clock-synchronous FIFO 34.

Figure 3:
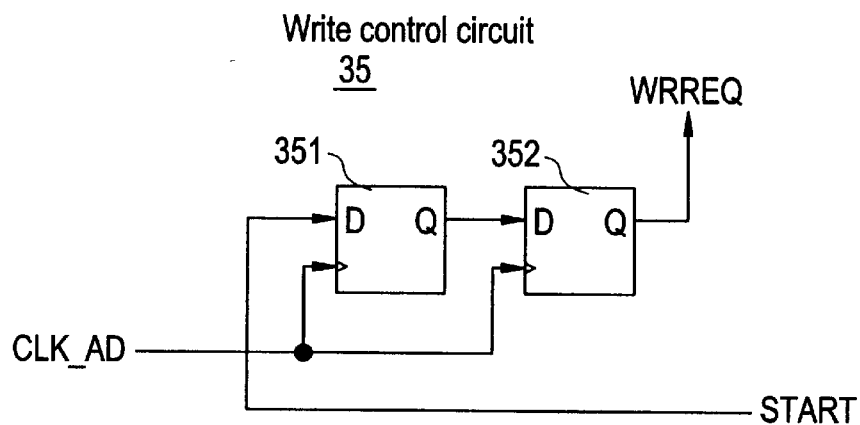
FIG. 3 is a block diagram showing an example of arrangement of the write control circuit.

FIG. 3 shows an example of arrangement of the write control circuit 35.

Figure 4:
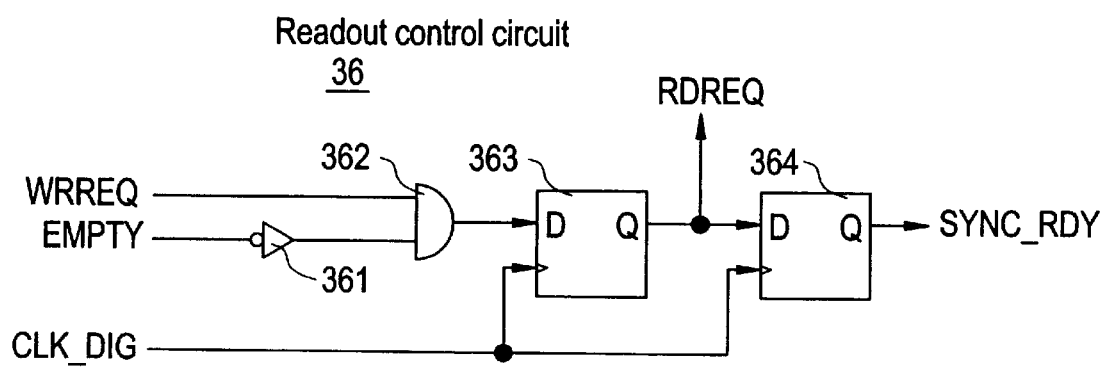
FIG. 4 is a block diagram showing an example of arrangement of the readout control circuit.

The write control circuit 35 is made up of two D-type flip-flops 351 and 352 connected in series, and the write request signal WRREQ becomes "H" at the second rise of the clock of the data ready signal CLK_AD after the start signal START indicative of the commencement of storing has become FIG. 4 shows an example of arrangement of the readout control circuit 36.

The readout control circuit 36 is made up of an inverting circuit 361, an AND gate 362, and two D-type flip-flops 363 and 364 connected in series, and the read request signal RDREQ and the sync ready signal SYNC_RDY become "H" at the first and second rises, respectively, of the clock signal CLK_DIG for the digital signal process after the write request signal WRREQ has become "H" and the empty signal EMPTY has become "L".

FIG. 5 shows the timing of the data ready signal CLK_AD, clock signal CLK_DIG for the digital signal process, start signal START, write request signal WRREQ, digital data (FIFO) stored in the dual-clock-synchronous FIFO 34, empty signal EMPTY, read request signal RDREQ, digital data D_FIFO released from the dual-clock-synchronous FIFO 34, and sync ready signal SYNC_RDY.

At the rise of the data ready signal CLK_AD, the digital data D_DIG is released from the latch 33. When the start signal START becomes "H", the write request signal WRREQ becomes "H" at the second rise of the data ready signal CLK_AD. During the "L" period of the write request signal WRREQ, the dual-clock-synchronous FIFO 34 does not store the digital data D_DIG. When the write request signal WRREQ becomes "H", the dual-clock-synchronous FIFO 34 stores the digital data D_DIG. The dual-clock-synchronous FIFO 34 releases the empty signal EMPTY of "H" when it does not store the digital data D_DIG, and it turns the empty signal EMPTY to "L" when it store at least one piece of digital data D_DIG. The read request signal RDREQ becomes "H" at the first rise of the clock signal CLK_DIG for the digital signal process after the write request signal WRREQ has become "H" and the empty signal EMPTY has become "L". When the read request signal RDREQ becomes "H", the dual-clock-synchronous FIFO 34 releases the digital data D_FIFO in synchronism with the rise of the clock signal CLK_DIG for the digital signal process. The sync ready signal SYNC_RDY becomes "H" at the second rise of the clock signal CLK_DIG for the digital signal process after the read request signal RDREQ has become "H".

The digital signal process section 40 operates based on the clock signal CLK_DIG for the digital signal process to read in the digital data D_FIFO and implement the digital signal process such as digital demodulation (digital orthogonal detection) and digital filtering, and thereafter it delivers resulting data to the computer 7.

The control logic section 11 operates based on the clock signal CLK_DIG for the digital signal process to turn the start signal START to "H" or "L" in accordance with the command from the computer 7. It also initiates the operation of the digital signal process section 40 after the sync ready signal SYNC_RDY has become "H".

The computer 7 issues a command of turning the start signal START to "L" at the time of power-on, issues a command of turning the start signal START to "H" at the timing slightly before the commencement of data collection, and issues a command of turning the start signal START to "L" on completion of data collection.

According to the fast A/D conversion signal processor 10 described above, even in the presence of discordance in terms of timing between the output of digital data D_AD from the fast A/D converter 21 and the clock signal CLK_DIG for a digital signal process used by the digital signal process section 40, it is possible to deliver the digital data D_AD from the fast A/D converter 21 to the digital signal process section 40 properly by absorbing the discordance with the dual-clock-synchronous FIFO 34. Based on the easy switching of the operation clock frequency, it is applicable to MRI apparatus of arbitrary magnetic field strength such as 0.2T–1.5T, 3T and 4T.

According to the RF receiver circuit 20 and digital receiver front end circuit 30 described above, it is possible to arrange the fast A/D conversion signal processor 10 properly.

According to the MRI apparatus 100 described above, it becomes possible to attain the digitization of process of the received signal.

Second Embodiment

Figure 6:
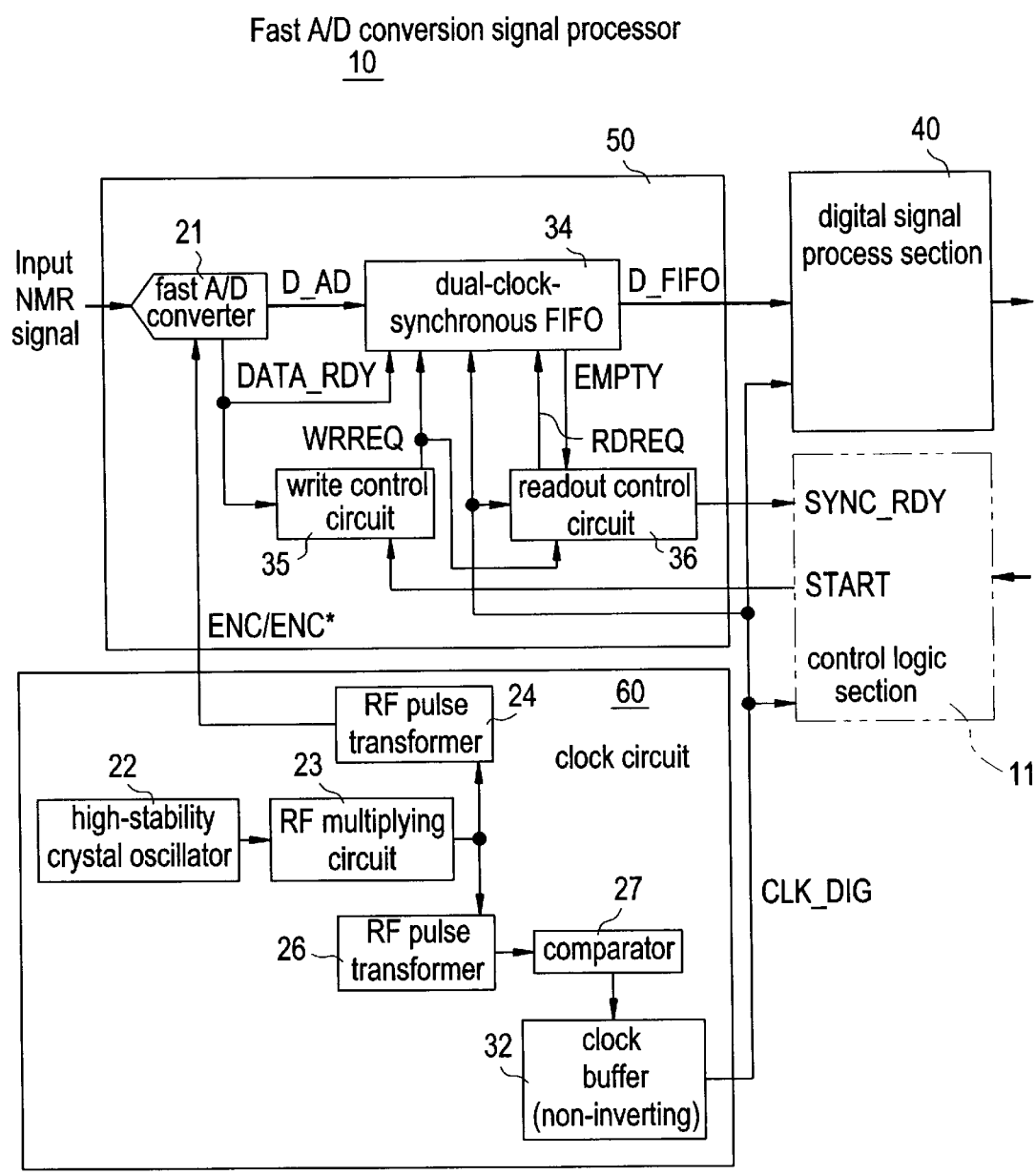
FIG. 6 is a block diagram showing the fast A/D conversion signal processor based on the second embodiment.

FIG. 6 is a block diagram showing another example of arrangement of the fast A/D conversion signal processor 10.

This fast A/D conversion signal processor 10 is arranged to include a fast A/D conversion device 50, a clock circuit 60 and a digital signal processing circuit 40 which are formed in an LSI (Large Scale Integration) device.

The fast A/D conversion device 50 is arranged to include a fast A/D converter 21 which converts an input NMR signal into digital data D_AD at an operation speed of 20 MHz, 40 MHz, etc., a dual-clock-synchronous FIFO 34 which stores the digital data D_DIG in synchronism with a data ready signal CLK_AD when a write request signal WRREQ becomes "H", turns an empty signal EMPTY to "L" when it has stored at least one piece of digital data D_DIG, and reads out the stored digital data D_DIG and releases digital data D_FIFO in synchronism with a clock signal CLK_DIG for a digital signal process when a read request signal RDREQ becomes "H", a write control circuit 35 which responds to a start signal START provided by a control logic section 11 to turn the write request signal WRREQ to "H" in synchronism with the data ready signal CLK_AD, and a readout control circuit 36 which responds to the empty signal EMPTY provided the dual-clock-synchronous FIFO 34 to turn the read request signal RDREQ to "H" in synchronism with the clock signal CLK_DIG for the digital signal process and produces and releases to the outside a sync ready signal SYNC_RDY for indicating to the outside that the digital data D_FIFO is amid the release from the dual-clock-synchronous FIFO 34.

The clock circuit 60 is arranged to include a high-stability crystal oscillator 22, an RF multiplying circuit 23 which produces an RF clock signal having a frequency that is a multiple of the frequency of the output signal of the high-stability crystal oscillator 22, an RF pulse transformer 24 for fast A/D converter which produces differential RF clock signals ENC/ENC* to be used by the fast A/D converter from the RF clock signal, a separation RF pulse transformer 26 which produces from the RF clock signal a separated clock signal which is separated electrically from the RF clock signal, a comparator 27 which produces a clock signal for a digital signal process from the separated clock signal, and a clock buffer 32 which produces a clock signal CLK_

DIG for the digital signal process from the clock signal for the digital signal process provided by the comparator 27.

According to the fast A/D conversion signal processor 10 described above also, the virtually same operation and effectiveness as the first embodiment can be achieved. Owing to the LSI-designed fast A/D conversion device 50, the number of component parts can be smaller.

The LSI of fast A/D conversion device 50, which releases parallel digital data at a high speed, can be used in combination with a DSP (Digital Signal Processor), etc. for other purposes (e.g., a software wireless communication unit which supports the high quality and high dynamic range communication).

Other Embodiments

A PLL (Phase Locked Loop) synthesizer circuit may be used in place of the RF multiplying circuit 23.

The start signal START may be turned to "H" by use of a power-on reset signal.

Part or whole of the circuit may be formed of programmable devices such as a CPLD (Complex Programmable Logic Device) and FPGA (Field-Programmable Logic Array).

Many widely different embodiments of the invention may be configured without departing from the spirit and the scope of the present invention. It should be understood that the present invention is not limited to the specific embodiments described in the specification, except as defined in the appended claims.

What is claimed is:

1. A fast A/D conversion signal processor comprising:
a fast A/D converter which converts an input analog signal into digital data at an operation speed of 20 MHz or higher, said fast A/D converter comprising a high-stability crystal oscillator, an RE multiplying circuit which produces an RE clock signal having a frequency that is a multiple of the frequency of the output signal of said high-stability crystal oscillator, and an RF pulse transformer which produces differential RE clock signals to be used by said fast A/D converter from the RE clock;
a digital signal process section which implements a digital signal process for the digital data; and
a data memory device which stores the digital data released by said fast A/D converter in synchronism with a data ready signal provided by said fast A/D converter and reads out the stored digital data and delivers to said digital signal process section in synchronism with a clock signal for the digital signal process used by said digital signal process section.

2. The fast A/D conversion signal processor of claim 1, wherein said data memory device includes a dual-clock-synchronous FIFO, a write control circuit which responds to a start signal indicative of the commencement of storing to store the digital data released by said fast A/D converter into said dual-clock-synchronous FIFO in synchronism with the data ready signal, and a readout control circuit which responds to an empty signal provided by said dual-clock-synchronous FIFO to read the digital data out of said dual-clock-synchronous FIFO in synchronism with the clock signal for the digital signal process.

3. The fast A/D conversion signal processor of claim 2, wherein said readout control circuit produces and releases a sync ready signal for indicating to the outside that digital data is amid the readout of said dual-clock-synchronous FIFO.

4. The fast A/D conversion signal processor of claim 1 further comprising:
a separation RE pulse transformer which produced from the RE clock signal a separated clock signal which is separated electrically from the RE clock signal, and a comparator which produces the clock signal for the digital signal process from the separated clock signal.

5. An MRI apparatus including the fast A/D conversion signal processor of claim 1 and being adapted to process with said fast A/D conversion signal processor an NMR signal which is received by a receiving coil.

6. An RF receiver circuit comprising:
a fast A/D converter which converts an input analog signal into digital data at an operation speed of 20 MHz or higher;
a high-stability crystal oscillator;
an RF multiplying circuit which produces an RF clock signal having a frequency that is a multiple of the frequency of the output signal of said high-stability crystal oscillator;
an RF pulse transformer which produces differential RF clock signals to be used by said fast A/D converter from the RF clock signal;
a clock driver which delivers to the outside a data ready signal produced by said fast A/D converter;
a separation RF pulse transformer which produced from the RF clock signal a separated clock signal which is separated electrically from the RF clock signal;
a comparator which produces a clock signal for a digital signal process from the separated clock signal; and
a latch which holds and releases in synchronism with the data ready signal the digital data released by said fast A/D converter.

7. An MRI apparatus comprising:
an RE receiver circuit comprising:
a fast AID converter which converts an input analog signal into digital data at an operation speed of 20 MHz or higher;
a high-stability crystal oscillator;
an RF multiplying circuit which produces an RF clock signal having a frequency that is a multiple of the frequency of the output signal of said high-stability crystal oscillator; an RF pulse transformer which produces differential RF clock signals to be used by said fast A/D converter from the RF clock signal;
a clock driver which delivers to the outside a data ready signal produced by said fast AID converter;
a separation RF pulse transformer which produced from the RF clock signal a separated clock signal which is separated electrically from the RF clock signal;
a comparator which produces a clock signal for a digital signal process from the separated clock signal; and
a latch which holds and releases in synchronism with the data ready signal the digital data released by said fast AID converter;
a digital receiver front end circuit comprising:
a first clock buffer which produces a data ready signal from a first input clock signal;
a second clock buffer which produces from a second input clock signal and releases also to the outside a clock signal for a digital signal process;
a latch which holds and releases input digital data in synchronism with the data ready signal; and
a data memory device which stores the digital data released by said latch in synchronism with the data ready signal and reads out and releases the stored digital data in synchronism with the clock signal for the digital signal process; and a digital signal process section; and wherein an NMR signal received by a receiving coil is put as input analog signal into said RE receiver circuit, the digital data released by the latch of said RE receiver circuit is put as input digital data into said digital receiver front end circuit, the data ready signal provided the clock driver of said RE receiver circuit is put as a first input clock signal into said digital receiver front end circuit, the clock signal for the digital signal process provided by the comparator of said RE receiver circuit is put as a second input clock signal into said digital receiver front end circuit, and the digital data released by the dual-clock-synchronous FWO of said digital receiver front end circuit and the clock signal for the digital signal process provided by said second clock buffer are put into said digital signal process section.

8. An MRI apparatus comprising:
an RE receiver circuit comprising:
- a fast A/D converter which converts an input analog signal into digital data at an operation speed of 20 MHz or higher;
- a high-stability crystal oscillator;
- an RE multiplying circuit which produces an RE clock signal having a frequency that is a multiple of the frequency of the output signal of said high-stability crystal oscillator;
- an RE pulse transformer which produces differential RE clock signals to be used by said fast A/D converter from the RE clock signal;
- a clock driver which delivers to the outside a data ready signal produced by said fast AID converter;
- a separation RF pulse transformer which produced from the RF clock signal a separated clock signal which is separated electrically from the RF clock signal;
- a comparator which produces a clock signal for a digital signal process from the separated clock signal; and
- a latch which holds and releases in synchronism with the data ready signal the digital data released by said fast AID converter;
- a digital receiver front end circuit comprising:
  - a first clock buffer which produces a data ready signal from a first input clock signal;
  - a second clock buffer which produces from a second input clock signal and releases also to the outside a clock signal for a digital signal process;
  - a latch which holds and releases input digital data in synchronism with the data ready signal; and
  - a data memory device which stores the digital data released by said latch in synchronism with the data ready signal and reads out and releases the stored digital data in synchronism with the clock signal for the digital signal process, wherein said data memory device includes a dual-clock-synchronous FIFO, a write control circuit which responds to a start signal indicative of the commencement of storing to store the input digital data into said dual-clock-synchronous FIFO in synchronism with the data ready signal, and a readout control circuit which responds to an empty signal provided by said dual-clock-synchronous FIFO to read the digital data out of said dual-clock-synchronous FIFO in synchronism with the clock signal for the digital signal process; and
- a digital signal process section; and
- a control logic section which produces and puts the start signal into said digital receiver front end circuit in response to a pulse sequence; and wherein an NMR signal received by a receiving coil is put as input analog signal into said RF receiver circuit, the digital data released by the latch of said RF receiver circuit is put as input digital data into said digital receiver front end circuit, the data ready signal provided by the clock driver of said RF receiver circuit is put as a first input clock signal into said digital receiver front end circuit, the clock signal for the digital signal process provided by the comparator of said RE receiver circuit is put as a second input clock signal into said digital receiver front end circuit, the digital data released by the dual-clock-synchronous FIFO of said digital receiver front end circuit and the clock signal for the digital signal process provided by said second clock buffer are put into said digital signal process section, and the clock signal for the digital signal process provided by the second clock buffer of said digital receiver front end circuit is put into said control logic section.

9. An MRI apparatus comprising:
an RF receiver circuit comprising:
- a fast A/D converter which converts an input analog signal into digital data at an operation speed of 20 MHz or higher;
- a high-stability crystal oscillator;
- an RE multiplying circuit which produces an RE clock signal having a frequency that is a multiple of the frequency of the output signal of said high-stability crystal oscillator;
- an RE pulse transformer which produces differential RE clock signals to be used by said fast A/D converter from the RE clock signal;
- a clock driver which delivers to the outside a data ready signal produced by said fast AID converter;
- a separation RE pulse transformer which produced from the RE clock signal a separated clock signal which is separated electrically from the RE clock signal;
- a comparator which produces a clock signal for a digital signal process from the separated clock signal; and
- a latch which holds and releases in synchronism with the data ready signal the digital data released by said fast A/D converter;
- a digital receiver front end circuit comprising:
  - a first clock buffer which produces a data ready signal from a first input clock signal;
  - a second clock buffer which produces from a second input clock signal and releases also to the outside a clock signal for a digital signal process;
  - a latch which holds and releases input digital data in synchronism with the data ready signal;
  - a data memory device which stores the digital data released by said latch in synchronism with the data ready signal and reads out and releases the stored digital data in synchronism with the clock signal for the digital signal process, wherein said data memory device includes a dual-clock-synchronous FIFO, a write control circuit which responds to a start signal indicative of the commencement of storing to store the input digital data into said dual-clock-synchronous FIFO in synchronism with the data ready signal, and a readout control circuit which responds to an empty signal provided by said dual-clock-synchronous FIFO to read the digital data out of said dual-clock-synchronous FIFO in synchronism with the clock signal for the digital signal process, wherein said readout control circuit produces and releases a sync ready signal for indicating to the outside that digital data is amid the readout of said dual—clock—synchronous FIFO;

a digital signal process section; and a control logic section which produces and puts the start signal into said digital receiver front end circuit in response to a pulse sequence; and wherein an NMR signal received by a receiving coil is put as input analog signal into said RF receiver circuit, the digital data released by the latch of said RF receiver circuit is put as input digital data into said digital receiver front end circuit, the data ready signal provided by the clock driver of said RF receiver circuit is put as a first input clock signal into said digital receiver front end circuit, the clock signal for the digital signal process provided by the comparator of said RF receiver circuit is put as a second input clock signal into said digital receiver front end circuit, the digital data released by the dual-clock-synchronous, FIFO of said digital receiver front end circuit and the clock signal for the digital signal process provided by said second clock buffer are put into said digital signal process section, and the sync ready signal provided by the readout control circuit of said digital receiver front end circuit and the clock signal for the digital signal process provided by the second clock buffer are put into said control logic section.

10. The fast A/D conversion signal processor of claim 1 further comprising:

a fast A/D converter which converts an input analog signal into digital data at an operation speed of 20 MHz or higher, a high-stability crystal oscillator, an RF multiplying circuit which produces an RF clock signal having a frequency that is a multiple of the frequency of the output signal of said high-stability crystal oscillator, and an RF pulse transformer which produces differential RF clock signals to be used by said fast A/D converter from the RF clock; and a data memory device which stores the digital data released by said fast A/D converter in synchronism with a data ready signal provided by said first A/D converter and reads out the stored digital data in synchronism with a readout clock signal provided from the outside.

11. The fast A/D conversion device of claim 10, wherein said data memory device includes a dual-clock-synchronous FIFO, a write control circuit which responds to a start signal provided from the outside to store the digital data released by said fast A/D converter into said dual-clock-synchronous FIFO in synchronism with the data ready signal, and a readout control circuit which responds to an empty signal provided by said dual-clock-synchronous FIFO to read the digital data out of said dual-clock-synchronous FIFO in synchronism with the readout clock signal.

12. The fast A/D conversion device of claim 11, wherein said readout control circuit produces and releases a sync ready signal for indicating to the outside that digital data is amid the readout of said dual-clock-synchronous FIFO.

\* \* \* \* \*

UNITED STATES PATENT AND TRADEMARK OFFICE
CERTIFICATE OF CORRECTION

PATENT NO.   : 6,624,777 B2
DATED        : September 23, 2003
INVENTOR(S)  : Hiroyuki Miyano It is certified that error appears in the above-identified patent and that said Letters Patent is hereby corrected as shown below:

Column 11,
Lines 34, 35, 38 and 39, delete "RE" and insert therefore -- RF --

Column 12,
Lines 3, 4, 5 and 36, delete "RE" and insert therefore -- RF --
Lines 37, 48 and 57, delete "AID" and insert therefor -- A/D --.

Column 13,
Lines 6, 7, 10, 13, 21, 30, 31 and 32, delete "RE" and insert therefore -- RF --
Line 16, delete "FWO" and insert therefor -- FIFO --.
Line 26, delete "RE" and insert therefore -- RF -- (both occurrences)
Lines 34 and 44, delete "AID" and insert therefor -- A/D --.

Column 14,
Lines 14, 36, 37, 38, 41, 42 and 43, delete "RE" and insert therefore -- RF --
Line 32, delete "RE" and insert therefore -- RF -- (both occurrences)
Line 40, delete "AID" and insert therefor -- A/D --.

Column 15,
Line 29, delete "synchronous, FIFO" and insert therefor -- synchronous FIFO --.

Column 16,
Lines 3 and 4, delete "The fast A/D conversion signal processor of claim 1 further comprising:" and insert therefor -- A fast A/D conversion device comprising: --.

Signed and Sealed this

Thirteenth Day of April, 2004

JON W. DUDAS
*Acting Director of the United States Patent and Trademark Office*